United States Patent [19]
Asakawa

[11] 4,184,124
[45] Jan. 15, 1980

[54] OPERATIONAL AMPLIFIER

[75] Inventor: Tatsushi Asakawa, Suwa, Japan

[73] Assignee: Kabushiki Kaisha Suwa Seikosha, Tokyo, Japan

[21] Appl. No.: 786,905

[22] Filed: Apr. 12, 1977

[30] Foreign Application Priority Data

Apr. 12, 1976 [JP] Japan .................................. 51/41031

[51] Int. Cl.² ............................................. H03F 3/18
[52] U.S. Cl. ..................................... 330/264; 330/269; 330/288; 330/307
[58] Field of Search ............... 330/253, 257, 264, 267, 330/269, 288, 307, 255

[56] References Cited

U.S. PATENT DOCUMENTS

| | | | |
|---|---|---|---|
| 3,700,981 | 10/1972 | Masuhara | 330/307 X |
| 3,961,279 | 6/1976 | Davis | 330/253 X |
| 4,031,481 | 6/1977 | Yoshida | 330/269 X |
| 4,048,575 | 9/1977 | Musa | 330/255 X |

Primary Examiner—Lawrence J. Dahl
Attorney, Agent, or Firm—Blum, Kaplan, Friedman, Silberman & Beran

[57] ABSTRACT

An operational amplifier wherein each of the active elements is comprised of complimentary coupled pairs of insulated gate type field effect transistors is provided. A first active stage and a second active stage are coupled together to perform a predetermined transfer function. Each active element in the first and second stages are insulated gate type field effect transistors that are coupled in complementary pairs with the first stage and second stage being coupled to define mirror pairs.

21 Claims, 19 Drawing Figures

OPERATIONAL AMPLIFIER

BACKGROUND OF THE INVENTION

This invention is directed to operational amplifier circuitry comprised of insulated gate type field effect transistors, and in particular, to forming an operational amplifier circuit that is characterized by each of the active elements being formed of insulated gate type field effect transistors coupled in complementary pairs.

Digital circuitry comprised entirely of insulated gate field effect transistors, also known as MOS transistors, are well known in the art. Such digital circuitry is usually entirely formed of pairs of complementary coupled P-channel and N-channel transistors, often referred to as perfect complementary coupled MOS transistors or "PC-MOS transistors". When only a P-channel or N-channel transistor is required, in the integrated circuitry, such use is designated as a quasi-C-MOS transistor or "QC-MOS transistor".

It is noted that whereas digital circuitry formed of PC-MOS transistors and QC-MOS transistors have been provided, these MOS transistor constructions have not been utilized to a great degree in forming analog circuitry. Nevertheless, certain characteristics of PC-MOS circuitry, that cause same to be particularly suited for digital operation, are likely to cause same to be equally suited for analog circuit operation. For example, PC-MOS transistors, when utilized in digital circuitry, are utilized in a off-logic mode and, accordingly, current consumption is only effected when the transistor is in a transient state. Since the switching levels of MOS transistors are determined by the threshold voltage, PC-MOS circuits are characterized by one of the MOS transistors of the pair being turned ON when the other MOS transistor of the pair is turned OFF. This complementary operation causes PC-MOS circuits to be very stable, to have an extremely large OFF impedance that permits the magnitude of the logic signals to approach the supply voltage and, additionally, to limit the biasing current to $10^{-12}$A. Accordingly, such a high input impedance, renders same ideal for use in an operational amplifier circuit capable of operating in an analog mode. It is desired to form each of the active elements of an operational amplifier circuit of PC-MOS and/or QC-MOS transistors so that the operational amplifier can be formed on the same chip as digital circuitry comprised of the same MOS elements.

It is an object of the instant invention to provide an operational amplifier wherein each of the active elements is an insulating-gate-type field effect transistor.

A further object of the instant invention is to provide an operational amplifier for performing a predetermined transfer function that is formed of mirror pairs of C-MOS transistors.

Another object of the instant invention is to monolithically integrate operational amplifier circuitry capable of operating in an analog mode into the same circuit substrate as circuitry adapted to operate in a digital mode.

Still another object of the instant invention is to provide analog circuitry comprised essentially of insulated gate type field effect transistors in order to permit the analog circuitry to be fabricated on a circuit chip with the same reduction in cost, facility and reliability heretofore obtained in digital circuitry comprised of MOS transistors.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
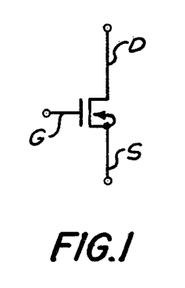
FIG. 1 is a circuit representation of an N-channel insulated gate type field effect transistor.
Figure 2:
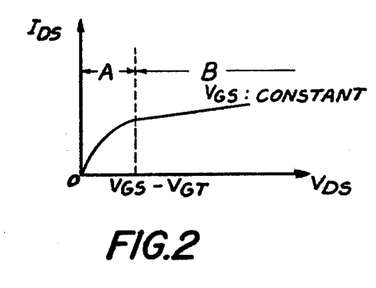
FIG. 2 is a graphical illustration of the drain current-drain voltage characteristic of the N-channel insulated gate type field effect transistor depicted in FIG. 1.

Turning now to the drawings, reference is first made to FIGS. 1 and 2, wherein an N-channel insulated gate type field effect transistor and a drain current-voltage characteristic therefor, are depicted. The drain current-drain voltage characteristic is obtained by holding the voltage $V_{GS}$ between the gate electrode G and source electrode S of the N-channel transistor constant and by varying the voltage $V_{DS}$ between the drain electrode D and source electrode S. Accordingly, the N-channel transistor is provided with a varying drain current $I_{DS}$ and a threshold voltage of $V_{GT}$, which threshold voltage determines a non-saturation region A and a saturation region B. The boundary which separates the respective regions can be algebraically determined as $V_{DS}=V_{GS}-V_{GT}$. When a first order approximation of the saturation region B is taken, as illustrated in FIG. 3, such region will provide a linearly variable result.

Figure 3:
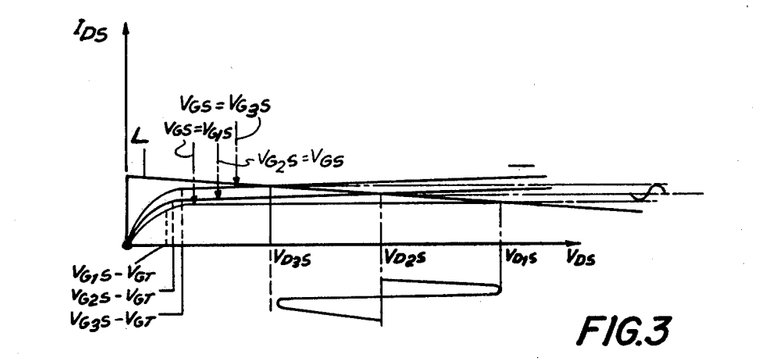
FIG. 3 is a graphical illustration comparing the respective drain current-drain voltage characteristics of the N-channel transistor depicted in FIG. 1, and the manner in which the voltage signals applied at the gate electrode are linearly amplified at the drain electrode.

As is illustrated in FIG. 3, a load line L will intersect the drain current $I_{DS}$ ordinate of $V_{GS}=V_{G2S}$ at a point at which $V_{DS}=V_{D2S}$. When such is the case, the signal $V_{GS}=V_{G2S}+(V_{G1S}-V_{G2S})$ thereby rendering $V_{DS}=V_{D1S}$ and, similarly, the signal $V_{GS}=V_{G2S}+(V_{G3S}-V_{G2S})$ thereby rendering $V_{DS}=V_{D3S}$ hence demonstrating that signals supplied to the gates are linearly amplified at the drain output terminals. Stated otherwise, the saturation region B, illustrated in FIG. 2, is a constant current region and these two characteristics, namely, the saturation region and the constant current permit an operational amplifier, formed of insulated gate type field effect transistors, to be provided.

Figure 4:
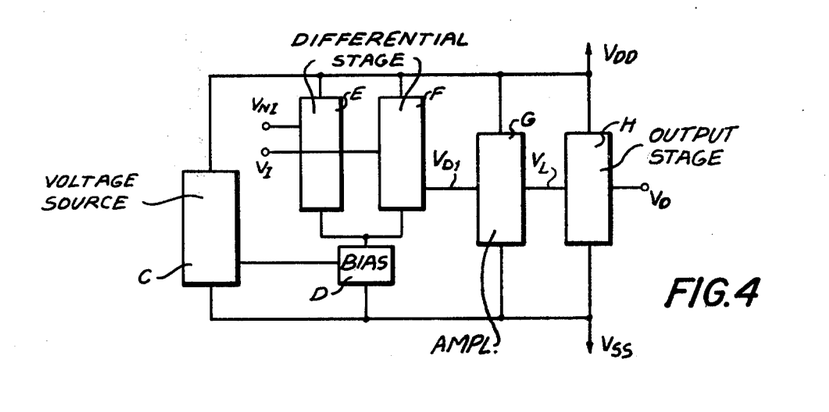
FIG. 4 is a block circuit diagram of an operational amplifier constructed in accordance with a preferred embodiment of the instant invention.

Reference is now made to FIG. 4, wherein operational amplifier constructed in accordance with a preferred embodiment of the instant invention is depicted. A standard voltage source C is coupled between a first voltage supply $V_{DD}$ and a second voltage supply $V_{SS}$ and is coupled to a constant current biasing circuit D, in order to apply a substantially constant voltage thereto. The constant current biasing circuit D is coupled to differential stages E and F, which stages form a mirror-pair of the operational amplifier and define the non-inverting input $V_{NI}$ and inverting input $V_I$ of the operational amplifier. The output $V_{DI}$ of the differential stages E and F is applied to a shift-level amplifier G, which amplifier shifts the level of the output of the differential stages and amplifies the output $V_{DI}$ and applies the amplified signal $V_L$ to an output stage H, which stage further amplifies the differentiated signal $V_L$ by a predetermined low impedance. As is detailed below, although the instant invention is directed to forming the operational amplifier from active elements, all of which are complementary coupled to MOS transistors, the manner in which an operational amplifier is fabricated, when each of the active elements are PC-MOS transistors, requires that same be biased to eliminate variations in the operation of the circuitry caused by variations in the supply voltage and changes in temperature. To this end, a voltage source circuit C and constant current biasing circuit D are provided to reduce the variations in the supply voltage seen by the operational amplifier and, additionally, to eliminate any affects on the operation of the operational amplifier caused by changes in temperature. As will be detailed below, variations in the offset voltage, produced by the mirror pair differential stages E and F, are substantially reduced not only by providing a highly stable standard voltage source C and a constant current biasing circuit D, but also by utilizing additional off-set reduction circuitry that can readily be fabricated on the same chip as insulated gate type field effect transistors forming the mirror pairs.

Figure 5:
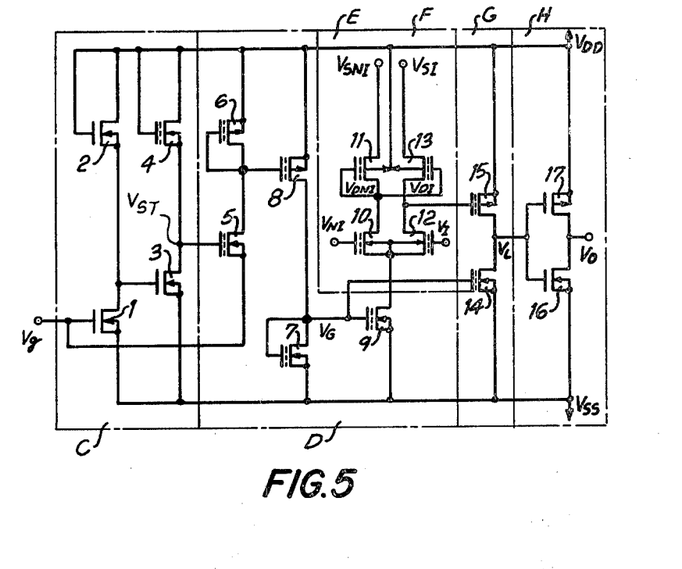
FIG. 5 is a detailed circuit diagram of the operational amplifier depicted in FIG. 4.

Reference is now made to FIG. 5 wherein an operational amplifier circuit, comprised solely of PC-MOS and QC-MOS elements, is depicted. As detailed above, two power supplies $V_{DD}$ and $V_{SS}$ are provided for operating the operational amplifier, the power supplies being referenced with respect to ground to define a relationship wherein $V_{DD}=GND-V_{SS}$. Accordingly, the standard voltage source C produces a voltage that is referenced with respect to GND and which is stable against variations in the supply voltage applied thereto, and also variations in temperature. Moreover, as is detailed below, the standard voltage delivered to the biasing circuit by the voltage source circuitry C is obtained without the necessity of referencing GND to a voltage that is exactly one-half the difference between $V_{DD}$ and $V_{SS}$. In order to obtain this result, and only utilize insulated gate type field effect transistors, the standard voltage $V_{ST}$ is selected to be the difference between the threshold voltages of insulated gate type field effect transistors, referenced with respect to GND.

Specifically, the voltage source circuit C includes N-channel transistors 1 and 2, which transistors have identical characteristics and produce an output signal having a voltage level $V_{dd}-V_g$, where $V_{DD}-V_{SS}=V_{dd}$. N-channel transistors 3 and 4, with the exception of their respective threshold voltages, are otherwise identical in every respect, such as having the same conductance coefficient.

The output of the N-channel transistors 3 and 4 is defined as $V_{ST}$, wherein $V_{ST}=V_{TN}-V_{GTN}+V_g$, when the threshold voltage of the N-channel transistor 3 is $V_{TN}$ and the threshold voltage of the N-channel transistor 4 is $V_{GTN}$. The different threshold voltages of the N-channel transistors 3 and 4 is obtained by doping one of the channels of the respective transistors by ion implantation when the N-channel transistors are fabricated. For example, when a C-MOS circuit is fabricated, a P−layer is formed on a low density N−substrate and a high density P−layer is utilized to obtain a desired threshold voltage $V_{TN}$. Accordingly, a threshold voltage $V_{GTN}$, that is lower than the threshold voltage $V_{TN}$ of the N-channel transistor 3, is obtained by ion implantation doping $^{31}P+$ in the channel defined beneath the gate electrode. If the channel is doped, in the manner described, and the N-channel transistors 3 and 4 are provided with gate films of equal thickness and with channels having nearly equal widths and lengths, the transistors 3 and 4 will have the same conductance coefficient but different threshold voltages. Moreover, both N-channel transistors 3 and 4 will have the same temperature characteristic since the shift in threshold voltage will be $$\frac{qN_{net}}{C_{ox}},$$

where the net implantation quantity of the threshold voltage shift is defined as $N_{net}$, the quantity of elementary charge is defined as q and the unitary gate capacitance is defined as $C_{ox}$. It is noted however, that when it is desired to reduce the density of a P$^-$ layer and obtain a higher threshold voltage by utilizing $^{11}$B+ channel doping, it has been found to be sufficiently sensitive as to make it difficult not only experimentally, but even theoretically, to obtain conductance coefficients in the transistors that are equal to each other. Similarly, changing the threshold voltages of the respective transistors by controlling the thickness of the gate film so that the N-channel transistor 3 has a thicker gate film than the N-channel transistor 4, has been found to be less than completely satisfactory even though the same conductance coefficients can be obtained by properly dimensioning the respective transistors, since the temperature characteristics of the threshold voltage are dependent upon the thickness of the gate film. Thus, the threshold voltages are preferably varied in the manner described above, wherein channel-doping by implantation of $^{31}$P+ is utilized.

It is noted that, as utilized in the instant application, transistors illustrated in the drawings with a dashed line at the gate electrode are insulated gate type field effect transistors wherein the threshold voltage thereof has been lowered by channel-doping in the manner detailed above. Moreover, in the voltage source circuit C, N-channel transistors are utilized since the N$^-$ substrate of the P-channel transistors are more readily common to most C-MOS configurations. However, a P$^-$ substrate can additionally be used for the power source. What is important is that the same type but electrically separated substrates must be utilized to assure that the characteristics of the P and N-channel transistors 1 and 2 are equivalent.

Figure 6:
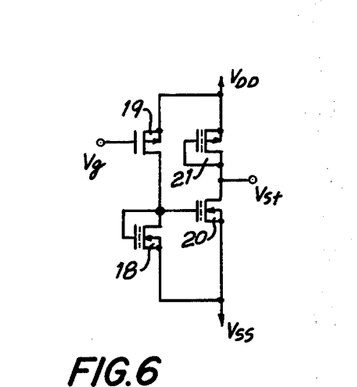
FIG. 6 is an alternate embodiment of the voltage source circuit depicted in FIG. 5.

It is noted however that the voltage source circuit C can be formed in the manner illustrated in FIG. 6, wherein the difference between the threshold voltages of the P-channel transistors 19 and 21 is utilized as the standard voltage by making the ratio of the conductance coefficients of the N-channel transistors 18 and 20, and the ratio of the conductance coefficients of the P-channel transistors 19 and 21 equal to each other. In the embodiment depicted in FIG. 6, a high density N$^-$ substrate is utilized to obtain the different transistor threshold voltages, with the transistors with the lower threshold voltages being formed by channel doping utilizing $^{11}$B+. Accordingly, it is to dope the respective channels of the P-channel transistors 19 and 21 can be doped by using different doping quantities, which technique can also be utilized with respect to the transistors 3 and 4, detailed above. It is noted, with respect to FIG. 6, that the N-channel transistors 18 and 20 can also be transistors having a high threshold voltage and, hence, need not be depicted as transistors having dashed lines at the gate electrodes thereof. Finally, as is detailed below, it is possible to omit the N-channel transistors 1 and 2, illustrated in FIG. 5, when GND=$V_{dd}/2$ since the gate potential of the N-channel transistor 3 could be selected to be $V_g$.

As is detailed above, the constant current biasing circuitry receives the standard voltage signal produced by the voltage source circuitry C, the standard voltage being shifted from a GND level to a predetermined level by the voltage supply $V_{SS}$. Accordingly, a constant current transistor 9 is supplied with a substantially constant gate potential by the voltage source circuitry C, in order to maintain the constant current bias on the differential stages constant.

Such a constant current bias can be obtained by making the ratio of the conductance coefficients of the N-channel transistors 5 and 7, and the P-channel transistors 6 and 8 equal so that the standard voltage obtained at the output of the voltage source circuitry C, and applied to the gate electrode of the N-channel constant current transistor 9 is $V_{TN}-V_{GTN}$. Accordingly, when the respective threshold voltages of the N-channel transistors are selected so that $V_{TN}-2V_{GTN}>0$, since $V_G=V_{TN}-V_{GTN}$, the gate potential of the constant current transistor 9 will be held stable when variations in the voltage, delivered by the power supply and temperature variations, occur. In order to take full advantage of the constant current characteristics of the transistors, the value $V_{TN}-2V_{GTN}$ should be lowered in order to assure that the current curve B, illustrated in FIG. 2, is constant so that the switching speed slew rate of the operational amplifier is not lowered to an undesirable value.

The respective differential stages E and F and the constant current biasing transistor 9 are the elements that are essential in determining the efficiency of the operational amplifier. The N-channel transistors 10 and 12 and P-channel transistors 11 and 13 define mirror-pair elements, often referred to as current mirrors. Each of the elements, forming the current mirrors, have the same operating characteristics. Specifically, when the respective input voltages applied to the gate electrodes of transistors 10 and 12 namely an inverting input $V_I$ and a non-inverting $V_{NI}$ are equally in phase with each other, the respective outputs $V_{DI}$ and $V_{DNI}$ are equal to each other, since the gate electrode of the P-channel transistor 11 is coupled to the drain electrode of the N-channel transistor 10 and, additionally, to the gate electrode of the P-channel transistor 13, so that the respective channel transistors, defining the current mirrors, operate in the saturation region B, illustrated in FIG. 2. It is notoed that the common mode inputs are not amplified as an output. Because the current applied to the differential stages is maintained constant by the constant current biasing circuitry D, the current flow being halved to the respective differential stages, the effective gate voltages of the transistors 11 and 13 are constant, thereby maintaining $V_{DNI}$ and $V_{DI}$ constant.

However, when an input of $V_{NI}=V_I+\alpha$ is applied, it is treated as a common mode input of $\alpha/2$ and as a differentialmode input of $\alpha/2$, to wit, $V_{NI}=(V_I+\alpha/2)+\alpha/2$ and $V_I=(V_I+\alpha/2)-\alpha/2$, respectively. Thus, the increase of the effective gate potential of the transistor 12 is $-\alpha/2$, and the increase in the effective gate potential of the transistor 10 is $\alpha/2$. Thus, the increase of the effective gate potential of 13 is also $\alpha/2$ when the conductance coefficients of 10 and 11 are equal to each other. Accordingly, the differential inputs are amplified with an efficiency that the sink current coincides with the source by effecting a shift of the voltage $V_{DI}$ of the drain connecting terminals of the transistors 12 and 13 so that more current flow through transistor 12, and less current flow through transistor 13, results. This result obtains since in FIG. 3, the load curve which is drawn from the point $V_{DS}=V_{dd}$ in place of the load line L is assumed to be symmetrical with the transistor curve $V_{GS}=V_{G2S}$ and the inclination of the load curve is substantially zero, so that the signal $V_{GIS} \approx V_{G2S}-\alpha$ is amplified. Therefore, the common-mode rejection ratio of the differential amplifier is high and the gate voltage of the constant current source 9 is stable against variations of the voltage levels delivered by the power supply and temperature variations, resulting in the common-mode rejection ratio being stable with respect to these operating parameters.

Figure 7:
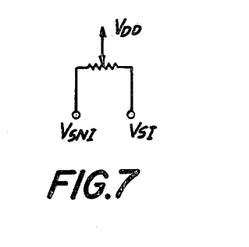
FIG. 7 is a circuit diagram of a three-terminal variable resistance network for reducing offset in the differential stages of the operational amplifier circuitry depicted in FIG. 5.
Figure 8:
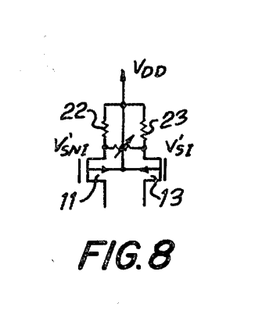
FIG. 8 is a circuit diagram of a two-terminal variable resistor arrangement for use with the differential stages of the operational amplifier circuitry depicted in FIG. 5.

$V_{SI}$ and $V_{SNI}$ are terminals that are utilized for providing offset control to the differential stages. For example, offset control can be effected by utilizing the three-terminal variable resistor, illustrated in FIG. 7. Alternatively, the offset between the intersection of the transistor 11 and the resistor 22, and that of the resistor 13 and the resistor 23, can be remotely controlled by the two-terminal variable resistor, illustrated in FIG. 8. As is illustrated in FIG. 8, the resistors 22 and 23 are monolithically integrated into a circuit chip and are comprised of diffusion regions, polycrystalline silicon layers or the like. Additionally, the same offset effect can be obtained by disposing the three-terminal variable resistor, illustrated in FIG. 7, between the terminals $V_{SI}$, $V_{SNI}$ and $V_{DD}$ by utilizing the source electrode of transistor 10 as the terminal $V_{SI}$, and the source electrode of transistor 12 as the terminal $V_{SNI}$ and referencing the drain electrode of the constant current transistor 9 to the voltage level $V_{DD}$.

The instant invention recognizes the importance of reducing the offset voltage of the differential stages. For example, with respect to the transistors 10 and 12, the equivalent of their respective conductance coefficients (mobility, thickness of gate film, channel length, channel width), threshold voltages and saturation resistances which are characterized by the following relationship:

$$\frac{aV_{DS}}{aI_{DS}}$$

Figure 9A:
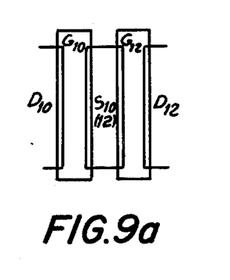
FIG. 9a is a schematic representation of the manner in which mirror pairs of insulated gate type field effect transistors, comprising the differential stages of the operational amplifier, depicted in FIG. 5, are fabricated on a circuit chip.
Figure 9B:
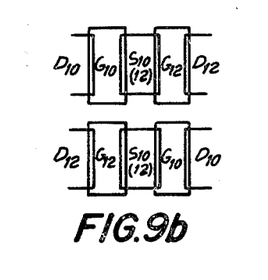
FIG. 9b is a schematic representation of the manner in which the mirror pairs of insulated gate type field effect transistors, comprising the differential stages of the operational amplifier, depicted in FIG. 5, can be fabricated on the same circuit chip in an improved manner.
Figure 10:
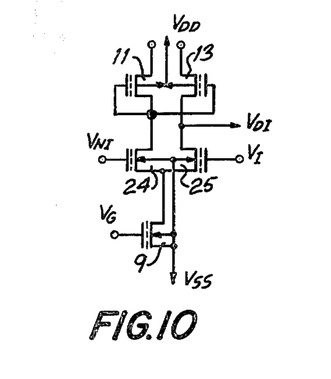
FIG. 10 is a circuit diagram of an alternate embodiment of the current biasing circuit and mirror pairs defining the differential stages of the operational amplifier circuit depicted in FIG. 5.

$V_G$ = constant, in the saturation region B illustrated in FIG. 2, which which permits the characteristics of the respective transistors to be substantially equal to each other. This equality of characteristics is further obtained by dividing the respective diffused regions and electrodes, forming the C-MOS elements. Specifically, FIG. 9a is a diagramatic representation of the manner in which the mirror pair of transistors 10 and 12 would be formed on the same circuit chip. However, as illustrated in FIG. 9b, by dividing the respective regions on the circuit chip by at least two, more equalized characteristics in the transistors can be obtained since such a construction permits compensation of the different characteristics and the manner in which same may vary. It is also important to lower, to the greatest extent possible, the value of the constant current of the differential amplifier, namely, the effective gate voltage $V_{TN}-2V_{GTN}$ of the constant current transistor 9 in order to maintain the slew rate of the operational amplifier at a desired value. When the gate voltage, of the constant current transistor 9, is maintained constant and variations in the conductance coefficient are reduced by utilizing the construction illustrated in FIG. 9b, better operation of the circuit under variations in the power supply, further reductions in the offset voltage and improvements in the power supply-rejection ratio are obtained. Moreover, the response of the operational amplifier to variations in temperature is improved by reducing the variation between conductance coefficients and by the reduced effective gate voltage of the constant current transistor 9. Additionally, as a result of the differential input elements are N-channel transistors, the input voltages, having levels slightly smaller than $2V_{GTN}$ to levels that are a little larger than $V_{DD}$, can be applied to the circuitry. If variations in the offset voltage, caused by increases and decreases in the threshold voltage resulting from body effect, are not taken into account, the substrate of transistors 10 and 12 can be referenced to the voltage level $V_{ss}$ as the substrates of transistors 24 and 25, illustrated in FIG. 10, can be referenced to the voltage level $V_{SS}$ so that input voltages, having levels slightly smaller than the threshold voltage level of the transistors having doped channels, can be applied to the circuitry.

The level circuitry G receives the output of the differential stages and applies the level-shifted and amplified signal to the output stage H. By utilizing the voltage source circuitry C and the constant current biasing circuitry D, variations in temperature or variable voltages delivered by the power supply do not cause errors to be introduced at the amplification stage, since the N-channel transistor 14 and P-channel transistor 15 are varied in the same direction, that is, the direction from each source to the drain is varied identically in response to changes in temperature and supply voltage, so that the output $V_L$ of the level-shift circuitry is also not varied in response to such changes. For the example illustrated in FIG. 5, amplification by the level-shift circuitry is similar to that illustrated in FIG. 3, wherein the load curve with is drawn from the point $V_{DS}=V_{dd}$ in the load line L is assumed to be symmetrical with the transistor curve $V_{GS}=V_{G2S}$, as compared to the characteristic curve illustrated in FIGS. 2 and 3, provides a high gain amplification.

Figure 11:
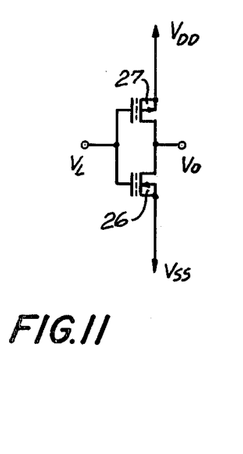
FIG. 11 is a circuit diagram of an alternate embodiment of an output stage capable of being utilized in the operational amplifier circuit depicted in FIG. 5.

The output stage H is comprised of PC-MOS circuitry including N-channel transistor 16 and P-channel transistor 17, for amplifying the output $V_L$ of the level shift circuitry. The threshold voltages of the C-MOS transistors 16 and 17 are retained at the higher level $V_T$ in order to increase the range of linear amplification of the output $V_o$. It is noted however that if a lowering of the output impedance is required, the channel lengths of the respective insulated gate type field effect transistors cn be made shorter than the channel lengths of the transistors forming the remaining amplifying stages or, alternatively, the threshold voltages of the transistors can be reduced to the level $V_{GT}$ in the manner illustrated by the PC-MOS circuit comprised of channel doped transistors 26 and 27, illustrated in FIG. 11. A further alternative output stage can adopt a source-follower configuration comprised of N-channel transistors 28 and 29 in order to obtain a low impedance output, this configuration being particularly suitable when the gain of the output circuit need not be considered. Moreover, the same effect can be obtained by referencing the substrate of the N-channel transistor 29 to the supply voltage $V_{SS}$ so that the substrate is not commonly referenced with the source. An emitter follower circuit, capable of operating in the same manner as a collector grounded NPN bipolar transistor emitter follower circuit, can be obtained by utilizing a P$^-$ layer in an N-channel substrate as the base to form an NPN bipolar transistor on the same substrate as the PC-MOS circuit configuration. To this end, a low impedance emitter follower output circuit will result from a connection of the base electrode of the bipolar transistor to the output $V_L$ of the level shift circuitry and from utilizing the diffusion region or polycrystalline silicon layers connected to the emitter electrode as an emitter load. Alternatively, the emitter follower output stage can be formed by utilizing the N-channel MOS 28, illustrated in FIG. 12, as an emitter load.

Figure 12:
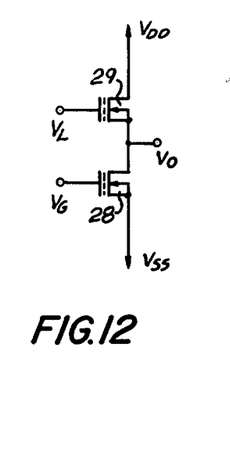
FIG. 12 is a further alternate embodiment of an output stage capable of being utilized in the operational amplifier circuit depicted in FIG. 5.
Figure 13A:
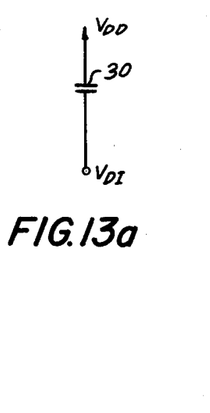
FIGS. 13a and 13b are circuit representations of a compensating capacitor to be utilized with the operational amplifier circuitry, depicted in FIG. 5.

When the operational amplifier circuitry, depicted in FIG. 5, is utilized as a differential amplifier, the output $V_o$ therefore renders it unnecessary to feedback the output $V_o$ to the respective inputs $V_I$ and $V_{NI}$ of the differential stages E and F, the instability of the circuit caused by oscillations produced by such feeding back of the output signal, does not occur. It is noted however that when the operational amplifier circuitry, depicted in FIG. 5, provides a transfer function, such as a common mode amplification, compensation for instabilities resulting from oscillations in the circuitry, can be realized by providing capacitors 30 or 31, respectively, illustrated in FIGS. 13a and 13b. Specifically, the capacitor 30 can be coupled between the voltage supply $V_{DD}$ and the output $V_{DI}$, but it is noted that the capacitor 30 can also be coupled to either the voltage supply $V_{SS}$ or referenced to GND. By comparison, the capacitance of the capacitor 31, illustrated in FIG. 13b, can be reduced to a unitary value for the amplifying rate of the level shift stage and provide the same frequency compensation. In the voltage follower circuit configuration in which, oscillations are easily produced, the compensating capacitance can be reduced to a unitary value for the gain of the output circuit by utilizing the voltage $V_L$ from the level-shift amplifier as the output of the operational amplifier circuitry, and eliminating the output stage H, by shortening the channel length of the transistors forming the output stage, by reducing the gain by narrowing the amplification range, in the manner illustrated in FIG. 11, or by reducing the gain of the output circuitry to a value such as one, as illustrated in FIG. 12. In each of these cases, the compensating capacitors can be monolithically integrated by utilizing a MOS type capacitance construction of the type illustrated in FIG. 14, to provide a compensating capacitance when the output $V_o$ or $V_L$ is fed back to the input $V_I V_{NI}$.

Figure 14:
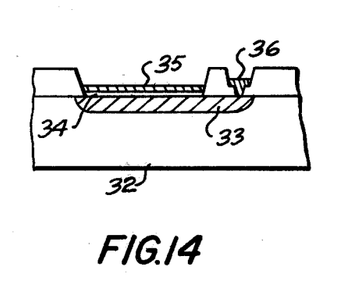
FIG. 14 is a sectional view of a compensating capacitor, of the type depicted in FIGS. 13a and 13b, monolithically integrated onto a circuit chip.
Figure 15:
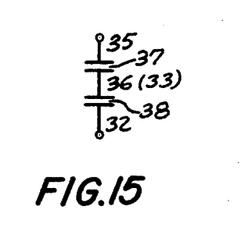
FIG. 15 is a circuit representation of a capacitor compensating circuit formed on a circuit chip in the manner depicted in FIG. 14.

Referring specifically to FIG. 14, the MOS capacitance includes a high density P+ region 33 diffused in an N− substrate 32. A gate insulating oxide film 34 is disposed between a P+ region 33 and a metal layer 35 such as aluminum, or the like, and additionally, a further metal alloy layer 36 is disposed in contact with the P+ region 33 diffused in the substrate to define the other terminal of the capacitor. The circuit equivalent of the MOS capacitor, illustrated in FIG. 14, is illustrated in FIG. 15, demonstrating the manner in which the capacitance is distributed thereby. The capacitor 37 has a capacitance per unit area that equals $\epsilon_{ox}/\tau$ where $\epsilon_{ox}$ represents the dielectric constant of the gate oxide film and $\tau$ represents the thickness of the gate oxide film. Accordingly, the greater the reduction in the thickness $\tau$ of the gate oxide film, the larger the capacitance of the capacitor 37. It is noted however that when the thickness of the film becomes 1000A or less, the film is susceptible to channel-doping therethrough. The gate oxide film is therefore formed at the same time that the gate films of the other MOS transistor elements are formed. The capacitor 38 includes a P+ diffusion layer and is on the order of one to several microns thick, and has a dielectric constant equivalent to the dielectric constant of the substrate, so that where the substrate is of the bulk silicon variety, the dielectric constant will be larger than that provided by the gate film. However, the capacitance of the capacitor 37 is larger than the capacitance of the capacitor 38 since the density of the substrate 32 is lower.

Figure 13B:
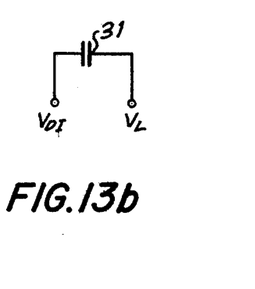

For example illustrated in FIG. 13b, the output terminal of the differential stage $V_{DI}$ or the output of the level shift stage $V_L$ can comprise the terminals 35 and 36, illustrated in FIG. 15. In such event, the terminals can be commonly coupled with the transistor 15 when $V_{DI}$ is 35 and $V_L$ is 36, since the diffused region 33, in the MOS capacitance construction illustrated in FIG. 14, is a drain region and the metallic layer 35 is a gate region. It is noted however that when the parasitic capacitance of the capacitor 38 must be considered, the terminal 35 of the capacitor 37 can be $V_L$ and the terminal 36 of the capacitor can be $V_{DI}$, or the terminal 35 can be coupled at $V_o$ and the terminal 36 coupled at the input $V_I$ to the differential stage F for feeding back the capacitance to the input of the operational amplifier. It is further noted that in C-MOS circuitry, the N-channel region can be used as a capacitance by making the substrate 32 a P− region and by diffusing an N+ region 33 therein.

In light of the foregoing, it is apparent that the operational amplifier of the instant invention is comprised of PC-MOS and QC-MOS insulated gate type field effect transistors formed on an N− substrate, as illustrated in the preferred exemplary embodiments detailed above, or alternatively, can be formed on a bulk silicon P− substrate. When formed on a P− bulk silicon substrate, the P and N regions are reversed so that the N regions are substituted by the P regions and the P regions are substituted by the N− regions, so that the conductance properties of the P-channel transistors, detailed above, are performed by the N-channel transistors, and alternatively, the conductance properties of the N-channel transistors become the same as the P-channel transistors in the embodiments detailed above. Additionally, the differential stages E and F, the amplification stage G, and the output stage H can also be comprised of MOS transistors wherein each, or both, of the P and N-channels are not doped. Also, the operational amplifier circuitry, illustrated and described in FIGS. 5 through 15, can be produced by doping only one of the P or N-channels. Specifically, channel doping of the P-channel transistors, comprising the amplifier, can be effected by ion implantation of only $^{11}B^+$ to thereby lower the threshold voltage of each of the P-channel transistors so doped, and by utilizing the voltage source circuitry C, illustrated in FIG. 6, with the only difference being the N-channel transistors 18 and 20 depicted without the dashed lines thereby indicating that same have not been channel doped to reduce the threshold voltage thereof.

It is noted that the stability of the operational amplifier circuitry, with respect to noise, can be improved by minimizing the thickness of the gate films of the transistors and by increasing the gate areas thereof. Moreover, by minimizing the thickness of the gate film, the saturation resistance is increased, thereby elevating the gain. Also, an increase in the gate area results in an increase of the channel length which, in turn, also improves the saturation resistance and, hence, elevates the gain. The operational amplifier circuitry comprised of three amplifying stages of QC-MOS and PC-MOS elements, having aluminum-gate transistor construction with a gate film having a thickness of 1000A or less, a channel length of $10\mu$ or more, obtained by utilizing a mask larger than that utilized in digital logic circuitry, and a substrate density of $10^{14}/cm^3$ or greater, will yield an open-loop gain of at least $10^4$ or greater, which also permits the supply voltage to be elevated to at least 5 V if the intervals between the respective stoppers and active elements is at least $2\mu$, so that the reverse leak current P-N junctions between respective active regions and the stoppers are reduced to thereby provide sufficient isolation between the elements in the circuit chip.

Moreover, the operational amplifier circuitry of the instant invention is characterized by the active elements being formed of insulated gate type field effect transistors that are capable of performing a predetermined transfer function. In particular, the operational amplifier can function as a differential amplifier by utilizing certain portions of the circuitry, illustrated in FIG. 5. For example, the differential amplifying stages E and F can be utilized with the voltage source circuitry C and biasing circuit D, or can be utilized with other suitable biasing circuitry, without the necessity of utilizing the level shift circuitry. Alternatively, the differential stages E and F can be utilized with the voltage supply circuitry C and constant current biasing circuitry D, and the level-shift circuitry G without utilizing the output stage H, described in detail above. Accordingly, the circuitry utilized for regulating the standard voltage and current, as well as the output circuitry for the operational amplifier are provided in order to permit the differential stages, comprised of insulating gate type field effect transistors, to realize an analog operation, although such operational amplifier circuitry is not limited thereto.

Also, in addition to providing a differential amplifier transfer function, the operational amplifier circuitry, depicted in FIG. 5, can be utilized as a comparator for comparing the two signals applied to the respective input terminals $V_I$ and $V_{NI}$ of the differential stages, or as a rectifier circuit for clipping input voltages larger than the supply voltage $V_{DD}$ by operating in a voltage follower configuration.

Figure 16:
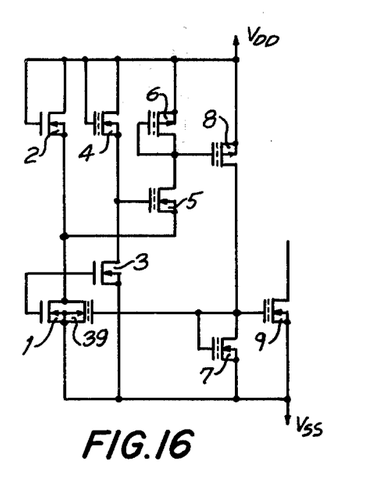
FIGS. 16 and 17, respectively, illustrate alternate embodiments of the voltage source circuits and biasing circuitry for use with the operational amplifier circuits, depicted in FIG. 5.
Figure 17:
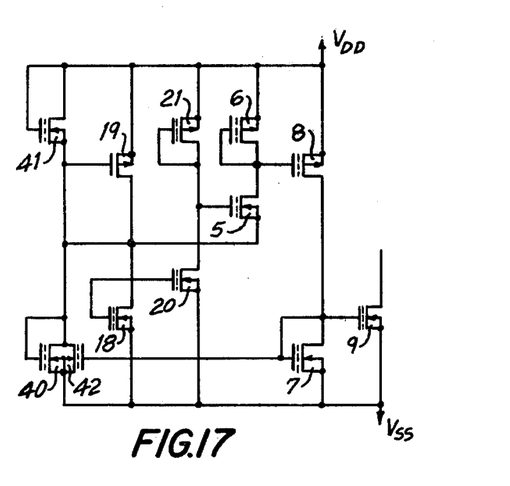

Reference is now made to FIGS. 16 and 17, wherein alternate embodiments of the voltage source circuitry C and current biasing circuitry D for use with operational amplifier circuitry, depicted in FIG. 5, is illustrated, like reference numerals being utilized to denote like elements depicted above.

In the circuitry depicted in FIG. 16, the GND reference level is determined by connecting the gate of the N-channel transistor 1 to the drain of the N-channel transistor 2 to thereby stabilize the GND reference level. Stabilization is further obtained by coupling the gate electrode of the N-channel transistor 1 to the source of the channel-doped N-channel transistor 5 and by adding an additional N-channel transistor 39, having the channel-doped to provide the same operating characteristics as the N-channel transistor 5 so that the current increase, resulting from the reduced threshold voltage of the N-channel transistor 5 and any problems that may result therefrom, are eliminated. This occurs because the effect of gate voltage of the N-channel transistor 5 is controlled by the N-channel transistor 39.

In FIG. 17, the GND reference level is obtained by utilizing heavily doped N-channel transistors 40 and 41, having the same characteristics, and by coupling the source of the transistor 5 to GND and providing an additional transistor 42 in order to eliminate problems likely to be caused by the increase of current in the transistor 5. As in the embodiments detailed above, forming the circuitry depicted in FIGS. 16 and 17, on a P$^-$ bulk silicon substrate instead of a N$^-$ substrate, can readily be obtained by merely interchanging the P and N regions.

For example, in the operational amplifier circuitry depicted in FIGS. 16 and 5, the the N$^-$ density of the substrate and the threshold voltage of the P-channel transistors can be determined by the threshold voltage of the N-channel transistors, obtained by utilizing only $^{31}$P+ ion implantation in the differential stages E and F as well as in the level shift and output stages G and H. Alternatively, in FIG. 17 and 5, the threshold voltage of, the N-channel transistors 40 and 41 can be obtained, by utilizing only $^{11}$B+ ion implantation in the differential stages E and F and the level shift amplifier and output amplifier stages G and H, thereby rendering threshold voltages of the N-channel transistors equal to the P-channel transistors that are channel doped. By such a construction, an outward GND reference level can be substituted for $V_{DD}$ for amplifying a small class of signals by utilizing a single power supply. Moreover, the operational amplifier circuitry can be utilized as a differential amplifier, comparator, rectifier or perform other transfer functions in a well known manner.

Accordingly, the instant invention is particularly characterized by analog circuitry formed entirely of insulated gate type field effect transistors being formed on the same MOS chip that would be utilized to form digital logic circuitry, the analog circuitry being capable of operating as an operational amplifier, differential amplifier, comparator, rectifier, or the like. Moreover, no further fabrication processes are needed since the channel doping, for the analog circuitry, can be effected at the same time that the digital circuitry is being fabricated. The instant invention is not limited to bulk silicon type insulated gate field effect transistors, but is equally applicable to sapphire, spinel or GaAs insulated gate field effect transistor constructions. The operational amplifier circuitry, constructed in accordance with the instant invention, is in every way comparable, in terms of cost, reliability, variety, and efficiency, to operational amplifier circuitry constructed of bipolar transistors.

It will thus be seen that the objects set forth above, among those made apparent from the preceding description, are efficiently attained, and since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An operational amplifier comprising a first differential stage and a second differential stage, each of said differential stages being formed of complementary pairs of insulated gate type field effect transistors having the same conductance characteristics and threshold voltages, said first and second differential stages defining a mirror pair, said first stage providing a first input and said second stage providing a second inverted input, and constant current biasing transistor means formed of an insulated gate type field effect transistor coupled in series to the like polarity transistors of said complementary pairs of insulated gate type field effect transistors in each differential stage, voltage source means coupled to said constant current biasing transistor for applying thereto a standard voltage having a predetermined voltage level, said voltage source means being comprised of at least two like polarity insulated gate field effect transistors having like conductive coefficients and different threshold voltages, said standard voltages applied to said constant biasing transistor means being determined by the difference between the respective threshold voltages of said insulated gate type field effect transistors comprising said voltage source means.

2. An operational amplifier as claimed in claim 1, and including level-shift amplifier means coupled to said first and second active stages for receiving an amplified load signal produced by said mirror pairs and in response thereto produce an amplified output signal.

3. An operational amplifier as claimed in claim 1, and including an output stage formed of a complementary coupled pair of insulated gate type field effect transistors coupled to said level-shift amplifier means for receiving said amplified load signal produced by said level-shift amplifier means and in response thereto producing an operational amplifier output signal.

4. An operational amplifier as claimed in claim 1, wherein each of the active elements of said voltage source means and said constant current biasing means are insulated gate type field effect transistors adapted to be formed on the same substrate as the insulated gate type field effect transistors comprising said first and second mirror pair active stages.

5. An operational amplifier as claimed in claim 4, wherein at least one of said insulated gate type field effect transistors in said voltage source means admits of a different threshold voltage than the other insulated gate type field effect transistors, each of said insulated gate type field effect transistors admitting of a different threshold voltage being formed by an ion implantation doping of respective regions of said transistors.

6. An operational amplifier as claimed in claim 5, wherein each of said insulated gate type field effect transistors having their channel region doped are N-channel transistors doped by $^{31}P+$ ion implantation.

7. An operational amplifier as claimed in claim 5, wherein each of the insulated gate type field effect transistors having their channel regions doped are P-channel transistors that are doped by $^{11}B+$ ion implantation.

8. An operational amplifier as claimed in claim 5, wherein each of the insulated gate type field effect transistors having doped and non-doped channel regions include a gate oxide film of the same thickness.

9. An operational amplifier as claimed in claim 3, wherein compensating capacitor means are coupled between one of said mirror pairs defining said first and second active stages and any of said voltage supply and said level-shift amplifier means and said output stage, said compensating capacitor means being monolithically formed in the same substrate at the same time as said insulated gate type field effect transistors, said compensating capacitor means having a gate oxide film that is the same thickness as the gate oxide film of the insulated gate type field effect transistors, said gate oxide film derivative capacitance defining the capacitance of said compensating capacitance means.

10. An operational amplifier as claimed in claim 3, wherein each of said insulated-gate field effect transistors comprising said voltage source circuitry, current biasing means and mirror pair active stages are monolithically integrated on the same substrate so that each insulated gate field effect transistor has a gate film with a thickness no greater than 1000A, a channel length of at least $10\mu$, a substrate density of at least $10^{14}/cm^3$ and an interval between respective stopper regions, defined by an electrically isolating layer, and the respective active regions of at least $2\mu$.

11. An operational amplifier as claimed in claim 10, wherein at least one of said insulated gate type field effect transistors in said voltage source means admits of a different threshold voltage than the remaining insulated gate type field effect transistors, each of the insulated gate type field effect transistors admitting of a different threshold voltage being formed by ion implantation doping of the respective channel regions of said transistors.

12. An operational amplifier as claimed in claim 11, wherein each of said insulated gate type field effect transistors having their channel region doped are N-channel transistors doped by $^{31}P+$ ion implantation.

13. An operational amplifier as claimed in claim 11, wherein each of the insulated gate type field effect transistors having their channel regions doped are P-channel transistors that are doped by $^{11}B+$ ion implantation.

14. An operational amplifier as claimed in claim 1, wherein said voltage source means includes at least first and second like polarity insulated gate type field effect transistors, said insulated gate transistors having different threshold voltages, said standard voltage produced by said voltage source means having a magnitude representative of the difference between the respective threshold voltages of said like polarity first and second insulated gate type transistors.

15. An operational amplifier as claimed in claim 1, wherein both said mirror pairs defining said first and second active stages include complementary coupled pairs of insulated gate type field effect transistors, and said constant current biasing circuit means includes a constant current insulated gate type field effect transistor coupled in series with like polarity insulated gate field effect transistors in said active stages, the other polarity insulated gate field effect transistors in each complementary pair defining said active stages producing an output signal representative of the current-mirror operation of the active stages.

16. An operational amplifier as claimed in claim 15, wherein one of the insulated gate type field effect transistors of said level shift means is of like polarity to said other polarity transistors in both mirror pair active stages, and the other of the insulated gate type field effect transistors of said level-shift means is of like polarity to said constant current insulated gate type field effect transistor, at least one of said insulated gate field effect transistors in said level shift means being coupled to one of said mirror pairs of insulated gate type transistors to receive the output signal produced thereby.

17. An operational amplifier as claimed in claim 15, and including an output stage, said output stage including a first insulated gate type field effect transistor of the same polarity as the constant current insulated gate type field effect transistor, said gate electrode of said first output stage transistor being referenced to said gate electrode of said constant current biasing transistor, and a further insulated gate type field effect transistor having the same polarity as said first output stage transistor, the gate electrode thereof being coupled to the output of the level shift means for receiving the output signal produced thereby.

18. An operational amplifier as claimed in claim 16, and including an emitter-follower output stage coupled to said shift level means.

19. An operational amplifier as claimed in claim 18, wherein said emitter-follower is a bipolar transistor integrated on the same substrate as said insulated gate type transistor, said bipolar transistor having the emitter load thereof formed of one of polycrystalline silicon layer and diffusion region, and said bipolar transistor having said base electrode coupled to the output of the level-shift means to receive the output signal produced thereby.

20. An operational amplifier as claimed in claim 15, and including resistance means coupled intermediate said voltage supply and said mirror pairs of transistors, said resistance means being provided for reducing the offset produced by said mirror pairs, said resistance means being one of a diffusion region and polycrystalline layer formed on the same substrate as said insulated gate type field effect transistor active elements.

21. An operational amplifier as claimed in claim 15, wherein each of the insulated gate type field effect transistors of the mirror pairs are divided into at least two distinct diffused constructions, in order to substantially equalize the properties of the respective insulated gate type field effect transistors comprising the mirror pairs.

* * * * *